United States Patent
Chen et al.

(10) Patent No.: US 6,627,525 B2
(45) Date of Patent: Sep. 30, 2003

(54) METHOD FOR PREVENTING POLYCIDE GATE SPIKING

(75) Inventors: Ming-Tsung Chen, Chu-Pei (TW); Kirk Hsu, Chu-Tung Chen (TW); Le-Tien Jung, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/774,816

(22) Filed: Jan. 31, 2001

(65) Prior Publication Data

US 2002/0102817 A1 Aug. 1, 2002

(51) Int. Cl.⁷ .......................................... H01L 21/3205
(52) U.S. Cl. ...................... 438/592; 438/683; 438/664; 438/655; 438/653; 438/299
(58) Field of Search .......................... 438/592, 299–301, 438/653, 682–683, 663–664, 655, 651

(56) References Cited

U.S. PATENT DOCUMENTS

| | | | | |
|---|---|---|---|---|
| 5,874,353 A | * | 2/1999 | Lin et al. | 438/592 |
| 5,981,320 A | * | 11/1999 | Lee | 438/199 |
| 6,136,636 A | * | 10/2000 | Wu | 438/231 |
| 6,187,674 B1 | * | 2/2001 | Chen et al. | 438/653 |
| 6,281,052 B1 | * | 8/2001 | Shinmura | 438/142 |

* cited by examiner

*Primary Examiner*—Carl Whitehead, Jr.
*Assistant Examiner*—Thanh Nguyen
(74) *Attorney, Agent, or Firm*—Dickinson Wright PLLC

(57) ABSTRACT

A method for preventing polycide gate spiking, which essentially comprises the following steps: forms an oxide layer on a substrate; forming a polysilicon layer on the oxide layer; sputtering a barrier layer on the polysilicon layer; performing a first rapid thermal process; sputtering a silicide layer on the barrier layer; performing a photolithography process and an etching process to remove part of the silicide layer, part of the barrier layer and part of the polysilicon layer to form a polycide gate; and performing a second rapid thermal process. Further, as it is necessary to use both rapid thermal processes, the invention can be expanded such that only one rapid thermal process is applied. Both rapid thermal processes use almost no oxygen.

22 Claims, 4 Drawing Sheets

METHOD FOR PREVENTING POLYCIDE GATE SPIKING

BACKGROUND OF THE INVENTION

1. Field of the Invention

The present invention relates to prevention of polycide gate spiking, and more particularly relates to a method for preventing spiking phenomena that is induced by barrier/silicide layer that is formed by the sputtering method.

2. Description of the Prior Art

As shown in FIG. 1A, in order to overcome disadvantages of polycide gate such as poor adhesion between silicide layer 14 and polysilicon layer 12, barrier layer 13 is used to connect silicide layer 14 and polysilicon layer 12. Herein, one important function of barrier layer 13 is to prevent reaction and interaction between metal of silicide layer 14 and polysilicon layer 12, and then to prevent occurrence of spiking phenomena. If occurrence of spike 15 is not properly prevented, as shown in FIG. 1B, quality of interface between silicide layer 14 and polysilicon layer 12 is degraded by directly contact, and more seriously, quality of dielectric layer 11, such as silicon dioxide layer, or even quality of substrate 10 also is degraded.

However, as shown in FIG. 1C, because barrier layer usually is formed by sputtering method in well-known technology (such as silicon nitride formed by sputtering method), structure of barrier layer is limited by available ability of sputtering method. As a result, structure of barrier layer 131 is not uniform but is an assemble of many grains where shape of each gain is column type. Obviously, interstices between adjacent grains provide channels where metal of silicide layer 14 penetrates through to polysilicon layer 12, and then barrier layer 131 can not effectively prevent occurrence of spike 15.

Certainly, chemical vapor deposition (CVD) method also is a popular method for forming barrier layer 13, and spike 15 is effectively prevented by barrier layer 13 that is formed by CVD method for structure of barrier layer 13 is uniform and number of interstice is neglectable. In contrast, stress between barrier layer 13 and polysilicon layer 12 is larger when barrier layer 13 is formed by CVD method, and then disadvantages such as peeling are unavoidable. In short, disadvantage of spikes is replaced by disadvantage of large stress and quality of polycide gate still is bad.

Moreover, silicide layer 14 also usually is formed by the sputtering method, and then structure of silicide layer 14 is amorphous. Because distribution of metal is non-uniform over amorphous silicide layer 14 and thickness of barrier layer 13 is decreased as size of total polycide gate is decreased, the opportunity that metal of silicide layer 14 penetrates into polysilicon layer 12 is increased when scale of semiconductor device is substantially decreased, especially when thermal diffusion is enhanced by any thermal process. Thus, spike phenomena is an unavoidable result under part of amorphous silicide layer 14 where proportion of metal is larger than other part of amorphous layer 14.

Accordingly, it is obvious that disadvantages of spike phenomena are unavoidable whenever sputtering method is used to form polycide gate. Then, because application of sputtering method is an almost indispensable, it is desired to develop an effective method for preventing occurrence of spiking.

SUMMARY OF THE INVENTION

The primary object of the invention is to provide a method for preventing the spiking phenomena of a polycide gate.

Another object of the invention is to present a method that prevents spiking phenomena by reconstructing structure of barrier layer/silicide layer.

A further object of the invention is to present a practical and simple method for preventing spiking phenomena.

In order to achieve previous objects of the invention, a preferred embodiment of the present method comprises the following essential steps: forming an oxide layer on a substrate; forms a polysilicon layer on the oxide layer; sputtering a barrier layer on the polysilicon layer; performing a first rapid thermal process; sputtering a silicide layer on the barrier layer; performing a photolithography process and an etching process to remove part of the silicide layer, part of the barrier layer and part of the polysilicon layer to form a polycide gate; and performing a second rapid thermal process.

Further, it is emphasized that the invention can be expanded such that only one rapid thermal process applied. Neither rapid thermal processes use oxygen.

Obviously, main spirit of the invention is to cover the conductor plug by plasma enhanced tetraethyl-orthosilicate layer that structure is compacted and deposit rate is high, and then some disadvantages of well-known technology are overcame.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 2A:
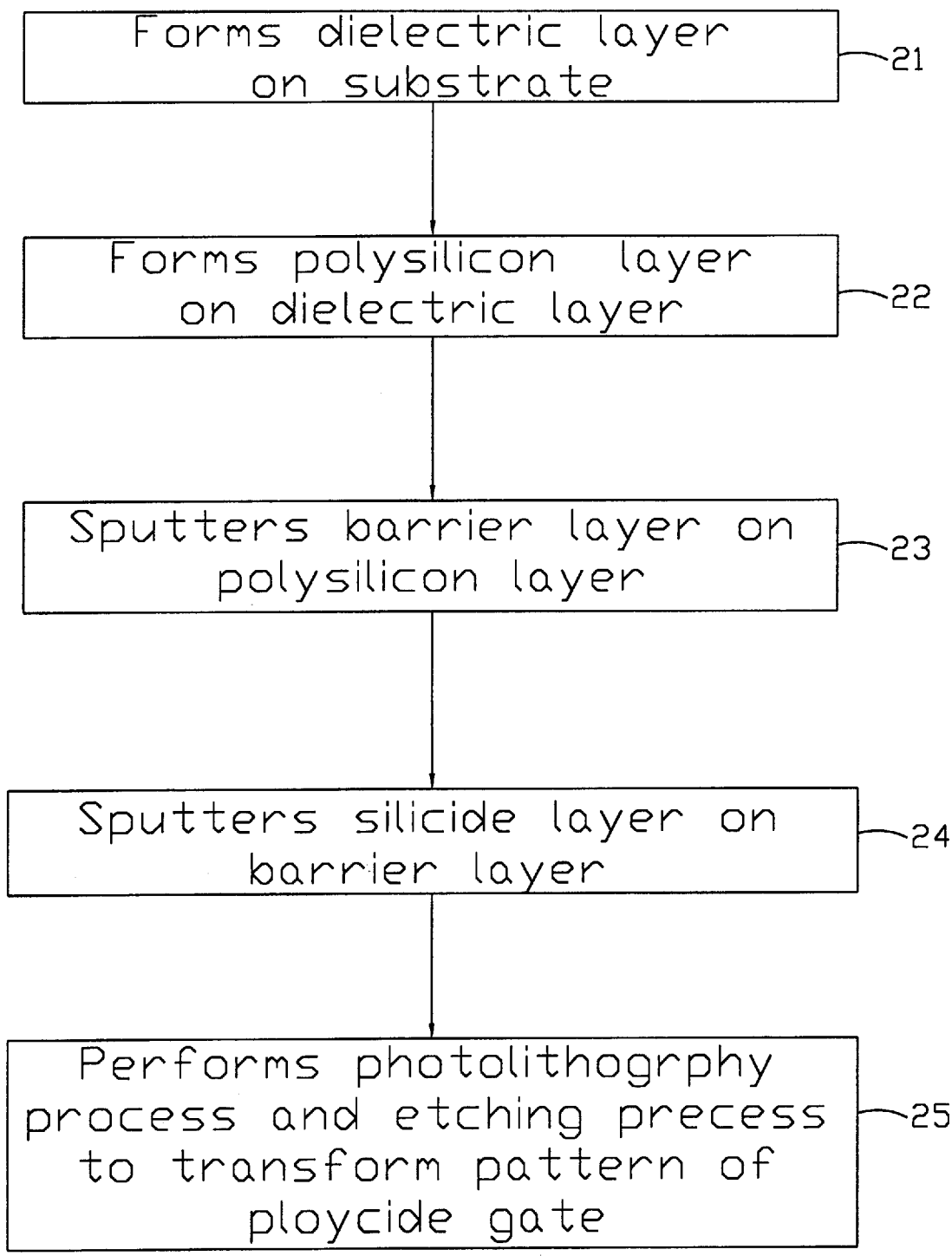
FIG. 2A is a well-known essential flow chart of method for forming polycide gate.

The essentials of the flow of a well-known method for forming a polycide gate by a sputtering method is briefly described in FIG. 2A: forming a dielectric layer on the substrate, dielectric layer block 21; forming a polysilicon layer on the dielectric layer, polysilicon layer block 22; sputtering a barrier layer on the polysilicon layer, barrier layer block 23; forming a silicide layer on the barrier layer, silicide layer block 24; transfering patterns of polycide gate by a photolithography process and an etching process, photolithography etching block 25. The dielectric layer usually is an oxide layer, such as a silicon dioxide layer, and specially is silicon dioxide layer that is formed by thermal oxidation. The material of barrier layer usually is titanium nitride and the material of the silicide usually is titanium silicide ($TiSi_2$).

Figure 1A:
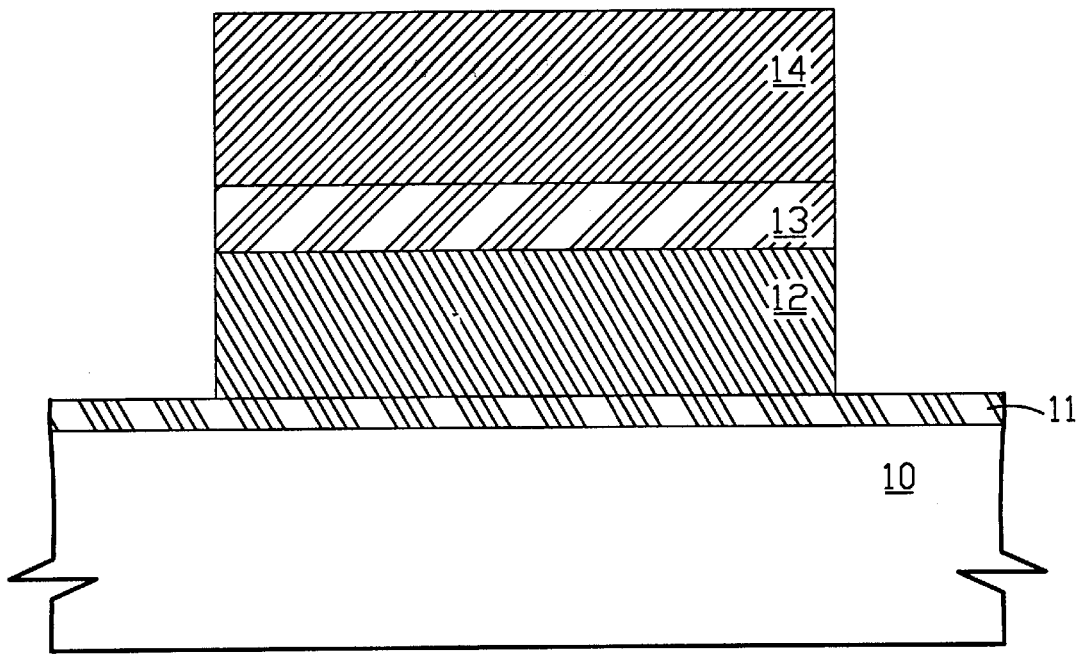
FIG. 1A is a structural sketch map of well-known polycide gate.
Figure 1B:
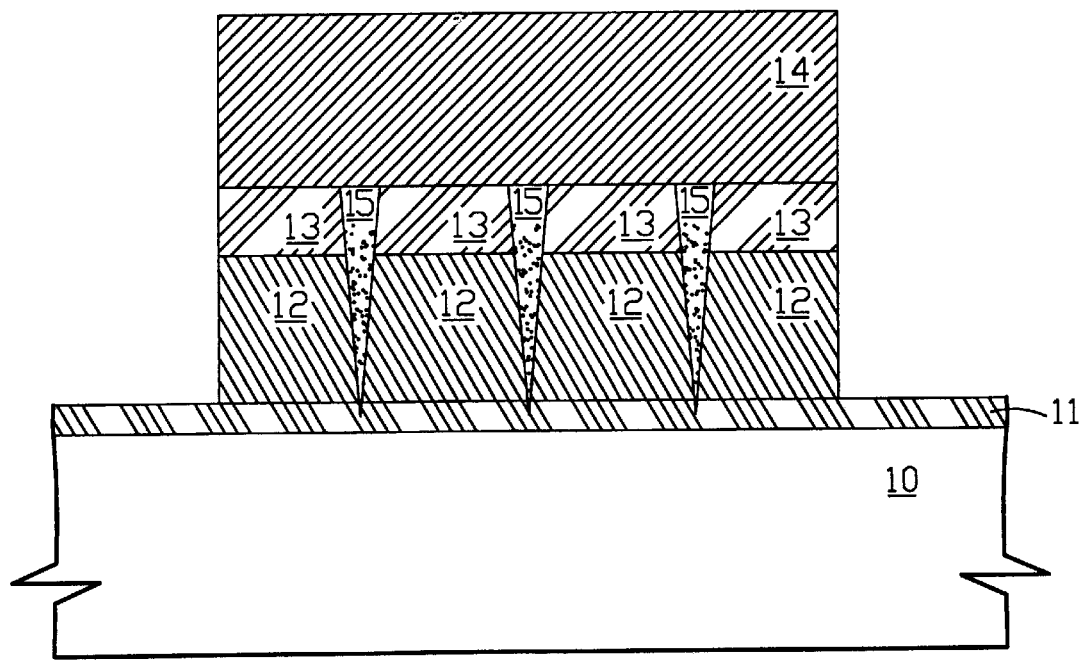
FIG. 1B is a sketch map about spiking phenomena of polycide gate.
Figure 1C:
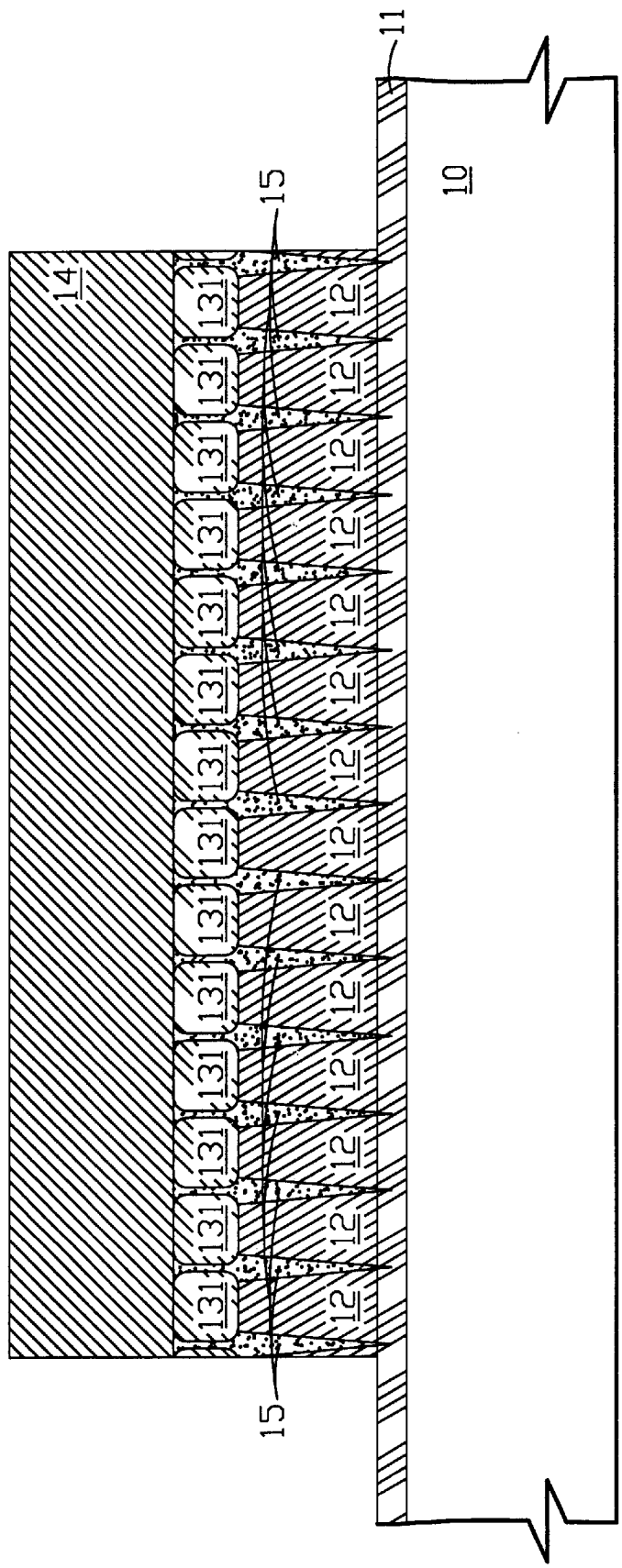
FIG. 1C is a sketch map about the spiking phenomena of polycide gate where a barrier layer is formed by sputtering method.

Because barrier layer block 23 buries the source of spiking phenomena that shown in FIG. 1C, and silicide layer block 24 buries source of spiking phenomena that is induced by thermal treated amorphous silicide layer. The best way to prevent spiking phenomena is immediately eliminating previous sources whenever any previous block is finished.

Owing to the truth that main disadvantage of sputtered barrier layer is interstices between adjacent grains which provides flowing channels, it is obvious that the best resolvent way is to eliminate these interstices. Herein, the present invention reconstructs structure of barrier layer by immediately performing a rapid thermal process when sputtered barrier layer is formed.

Herein, functions of the rapid thermal process comprise both rearranging locations of all grains and infusing adjacent brains that is useful for blocking or even eliminating interstices. Further, to avoid affect property of barrier layer, used gas of rapid thermal process usually is not oxygen but usually is nitrogen or inert gas. One main advantage of nitrogen is that application of rapid thermal nitridation process can insert nitrogen (ions, atoms or molecules) into interstices or even grains, and then isolating ability of barrier layer is strongly enhanced. For example, when barrier layer is sputtered titanium nitride layer, rapid nitridation process which reacting temperature is about 600° C. to 900° C. can let nitrogen reacts with edges of brains of silicon nitride. Thus, nitrogen will attach on surfaces of grains and fill interstices, and isolating ability of sputter titanium nitride layer is obviously improved.

In summary, application of rapid thermal process not only can let stress of sputtered barrier layer be less than CVD barrier layer but also can significantly prevent occurrence of spiking phenomena.

Because main disadvantage of the sputtered silicide layer is that the amorphous structure tends to induce the spiking phenomena during the following thermal process, the best resolvent way is to let structure of the silicide layer vary from an amorphous structure to stable structure just after sputtered silicide layer is formed.

Herein, the present invention performs a rapid thermal process right after sputtered silicide layer is formed, and function of the rapid thermal process is to let structure of sputtered silicide layer can be reconstructed and be more stable by thermal diffusion. For example, when silicide layer is sputtered titanium silicide layer, rapid thermal process which reacting temperature is about 750° C. to 900° C. can let amorphous structure be replaced by a more stable structure: the C54 phase structure. Certainly, because object of the rapid thermal process only is reconstruction of structure of silicide layer, used gas of the rapid thermal process usually is nitrogen or inert gas but is not oxygen.

In summary, the present invention at least includes following essential steps: forms an oxide layer on a substrate, dielectric block 26; forms a polysilicon layer on the oxide layer, polysilicon block 27; sputters a barrier layer on the polysilicon layer, barrier block 28; performs a first rapid thermal process, first thermal process block 29; sputters a silicide layer on the barrier layer, silicide block 30; performs both a photolithography process and an etching process to remove part of the silicide layer, part of the barrier layer and part of the polysilicon layer to form a polycide gate, patterning block 31; and performs a second rapid thermal process, second thermal process block 32.

Figure 2B:
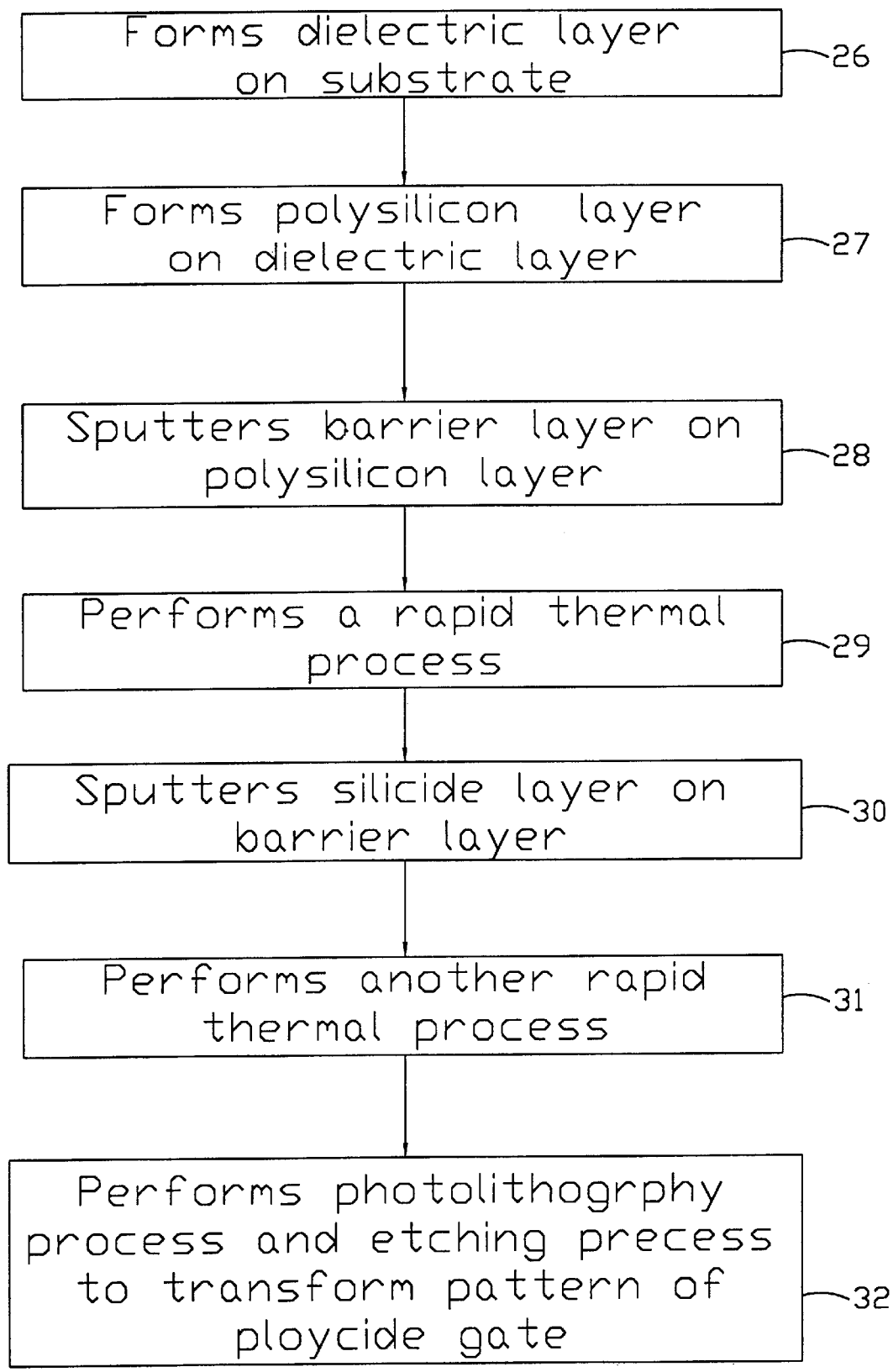
FIG. 2B is an essential flow chart of a method that present by the invention for preventing polycide gate spiking.

Herein, dielectric layer usually is oxide layer, and especially is the silicon dioxide layer formed by thermal oxidation method; material of barrier layer usually is titanium nitride; and material of silicide usually is $TiSi_2$. Besides, though only rapid thermal process is mentioned during above discussion, the invention can be expended to include application of other thermal processes and the only limitation is that effect of thermal diffusion should be properly controlled. Further, though patterning block 31 is mentioned before second thermal process block 32, but because that spirit behind the invention is to stabilize structure of silicide layer by thermal process and both photolithography process and etching process seldom use thermal process, it is reasonable that order of patterning block 31 and second thermal process block 32 is exchangeable, as shown in FIG. 2B.

It should be emphasized that the invention also can be expended to that it is not necessary to perform both first thermal process block 29 and second thermal process 32 whenever at least one of barrier layer and silicide layer is not formed by sputtering method. In fact, in accordance with spirit of the invention, first thermal process 29 is desired to be preformed only when barrier layer is formed by sputtering method; and second thermal process 32 is desired to be performed only when silicide layer is formed by sputtering method.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for preventing titanium polycide gate spiking, comprising forming an oxide layer on a substrate;

forming a polysilicon layer on said oxide layer;

sputtering a titanium nitride layer on said polysilicon layer;

performing a rapid thermal process immediately after said step of sputtering said titanium nitride layer on said polysilicon layer;

forming a titanium silicide layer on said titanium nitride layer; and performing a photolithography process and an etching process to remove part of said titanium suicide layer, part of said titanium nitride layer and part of said polysilicon layer to form a titanium polycide gate.

2. The method of claim 1, wherein said oxide layer is a silicon dioxide layer.

3. The method of claim 2, wherein said silicon dioxide layer is formed by a thermal oxidation method.

4. The method of claim 1, wherein said rapid thermal process is performed without the usage of oxygen.

5. The method of claim 1, wherein the used gas of said rapid thermal process is nitrogen.

6. The method of claim 1, wherein the used gas of said rapid thermal process is the inert gas.

7. The method of claim 1, wherein reacting temperature of said rapid thermal process is about 600° C. to 900° C.

8. A method for preventing titanium polycide gate spiking, comprising forming an oxide layer on a substrate forming a polysilicon layer on said oxide layer;

sputtering a titanium nitride layer on said polysilicon layer; performing a first rapid thermal process immediately after said step of sputtering said titanium nitride layer on said polysilicon layer;

forming a titanium suicide layer on said titanium nitride layer;

performing a photolithography process and an etching process to remove part of said titanium silicide layer, part of said titanium nitride layer and part of said polysilicon layer to form a titanium polycide gate; and performing a rapid thermal process without the usage of the oxygen.

9. The method of claim 8, wherein said oxide layer is a silicon dioxide layer.

10. The method of claim 8, wherein said silicon dioxide layer is formed by a thermal oxidation method.

11. The method of claim 8, where used gas of said thermal process is nitrogen.

12. The method of claim 8, where used gas of said thermal process is the inert gas.

13. The method of claim 8, wherein reacting temperature of said rapid thermal process is about 750° C. to 900° C.

14. A method for preventing polycide gate spiking, comprising forming an oxide layer on a substrate;

forming a polysilicon layer on said oxide layer;

sputtering a barrier layer on said polysilicon layer, the structure of said barrier comprising a plurality of grains;

performing a first rapid thermal process immediately after said step of sputtering said barrier layer on said polysilicon layer;

sputtering a silicide layer on said barrier layer;

performing a photolithography process and an etching process to remove part of said suicide layer, part of said barrier layer and part of said polysilicon layer to form a polycide gate; and performing a second rapid thermal process without the usage of oxygen.

15. The method of claim 14, wherein said barrier layer is a titanium nitride layer.

16. The method of claim 14, where used gas of said first rapid thermal process is nitrogen.

17. The method of claim 14, where used gas of said first rapid thermal process is the inert gas.

18. The method of claim 14, wherein reacting temperature of said first rapid thermal process is about from 600° C. to 900° C.

19. The method of claim 14, the function of said first rapid thermal process comprising both rearranging locations of all said grains and infusion adjacent said grains.

20. The method of claim 14, where used gas of said second rapid thermal process is nitrogen.

21. The method of claim 14, where used gas of said second rapid thermal process is the inert gas.

22. The method of claim 14, wherein reacting temperature of said second rapid thermal process is about 750° C. to 900° C.

* * * * *